United States Patent [19]

Kimura

[11] Patent Number: 5,602,045
[45] Date of Patent: Feb. 11, 1997

[54] METHOD FOR MAKING A SEMICONDUCTOR DEVICE

[75] Inventor: Hideki Kimura, Kanagawa, Japan

[73] Assignee: Sony Corporation, Tokyo, Japan

[21] Appl. No.: 591,772

[22] Filed: Jan. 25, 1996

[30] Foreign Application Priority Data

Jan. 30, 1995 [JP] Japan .................................. 7-032977

[51] Int. Cl.⁶ .................................................. H01L 21/265
[52] U.S. Cl. .................................. 437/24; 437/25; 437/26; 437/27
[58] Field of Search .................................. 437/20, 24, 25, 437/26, 27

[56] References Cited

U.S. PATENT DOCUMENTS 4,617,066  10/1986  Vasudev ..................................... 437/27
5,244,820   9/1993  Kamata et al. .................. 448/DIG. 83
5,413,943   5/1995  Murakoski et al. ..................... 437/20

Primary Examiner—Trung Dang
Attorney, Agent, or Firm—Hill, Steadman & Simpson

[57] ABSTRACT

A method for making a microfine semiconductor device includes the step of forming a diffusion layer of a small depth to provide reduced junction leak current. Si ions are implanted at a dosage of from $1\times10^{15}$ to $1\times10^{16}$ cm$^{-2}$ into an Si substrate held at a temperature not higher than $-40°$ C. Then, impurity ion implantation into the Si substrate is conducted so as to form an impurity layer having a depth smaller than that of the amorphous layer. Consequently, it is possible to form an amorphous layer wherein elongation and an increase of dislocation loops at the interface between the amorphous layer and crystalline layer is suppressed. It is also possible to activate the impurity layer through annealing and still provide an impurity layer having a depth smaller than that of the amorphous layer.

14 Claims, 6 Drawing Sheets

METHOD FOR MAKING A SEMICONDUCTOR DEVICE

BACKGROUND OF THE INVENTION

The present invention relates to a method of producing a semiconductor device in which an impurity layer is formed through implantation of impurity ions and subsequent annealing.

The trend in manufacturing semiconductor devices is toward smaller, finer, more miniaturized devices. According to a scaling rule in the production of microfine field-effect type semiconductor devices, when reducing the minimum size to 1/L, it is necessary that the depth $X_j$ of junction between the impurity layer and the semiconductor substrate also is reduced to 1/L. To meet such a requirement, attempts have been made to lower the level of energy used in impurity ion implantation and to lower and shorten the temperature and time of annealing.

However, the above-mentioned attempt to lower and shorten the temperature and time of annealing alone cannot well cope with the demand for formation of an impurity layer having a sufficiently small thickness, when the micronization of semiconductor devices proceeds to such an extent as to require the depth $X_j$ meeting the condition of $X_j<0.1$ μm so that channeling tail of the ion-implanted impurity is not negligible.

When an impurity layer of a depth greater than that $X_a$ of the amorphous layer is formed by ion implantation as shown in FIG. 1A, it is impossible to suppress diffusion of impurities during annealing which is executed for the purpose of activating the ion-implanted impurities, as will be seen from FIG. 1B.

In contrast, when an impurity layer having a depth smaller than the depth $X_a$ of the amorphous layer is formed by ion implantation as shown in FIG. 1C, impurity is prevented from being diffused to a level deeper than the depth $X_a$ during annealing which is executed for the purpose of activating the ion-implanted impurity. Consequently, it is possible to form an impurity layer the depth of which is small enough even after annealing. For these reasons, the conventional semiconductor process employs formation of an amorphous layer prior to the ion implantation which is conducted for the purpose of forming an impurity layer.

It is to be noted, however, dislocation loops 11 appear after the annealing in the vicinity of the interface between the amorphous layer and the crystalline layer, as shown in FIGS. 1B and 1D. Meanwhile, FIG. 6 shows the change in the leak current at the junction between the impurity layer and the Si substrate, as observed when the depth $X_a$ of the amorphous layer is changed while the depth $X_j$ of the impurity layer is maintained constant. As will be understood from FIG. 6, the junction leak current starts to exhibit a remarkable increase when the depth Xa of the amorphous layer has been increased to such an extent that the position of a depletion layer of the junction coincides with the position of the dislocation loops 11.

More specifically, even when the diffusion of impurity to a depth greater than the depth $X_a$ of the amorphous layer is suppressed so as to ensure that the impurity layer has a small depth after the annealing as shown in FIGS. 1C and 1D, the position of the depletion layer and the position of the dislocation loops 11 coincide with each other in this state, thus allowing a large junction leak current to flow. Consequently, it has been impossible to produce microfine semiconductor devices by conventional production methods.

SUMMARY OF THE INVENTION

The present invention provides a new and improved method for making microfine semiconductor devices. In an embodiment, a method of producing a semiconductor device comprises the steps of: implanting Si ions into an Si substrate maintained at a temperature of not higher than −40° C., at a dosage of from $1\times10^{15}$ to $1\times10^{16}$ ions/cm², thereby forming an amorphous layer in the Si substrate; and implanting impurity ions in the Si substrate after the formation of the amorphous layer, so as to form an impurity layer having a depth smaller than that of the amorphous layer in the Si substrate.

In an embodiment, a semiconductor production method is characterized in that a temperature not higher than 0° C. is used and a dosage of from $3\times10^{14}$ to $1\times10^{16}$ ions/cm² is substituted for implanting ions selected from a group consisting of Ga ions, Ge ions and As ions instead of Si ions.

In an embodiment, a semiconductor production method further includes the step of maintaining the temperature of the Si substrate during the implantation of the impurity ions.

In an embodiment, the Si substrate is annealed in an atmosphere containing a halogen element, after implantation, thereby activating the ion-implanted impurity.

Other objects and advantages provided by the present invention will become apparent from the following Detailed Description, taken in conjunction with the Drawings, in which:

BRIEF DESCRIPTION OF THE DRAWINGS

FIG. 2 is a schematic sectional side elevational view of a semiconductor device, wherein FIG. 2A shows the semiconductor structure which is obtained when formation of an impurity layer is conducted while keeping the temperature of the semiconductor substrate at +15° C., while

FIG. 3 illustrates the relationship between the temperature of a semiconductor substrate and the density of generation of dislocation loops, wherein

DETAILED DESCRIPTION OF THE DRAWINGS

In accordance with a preferred embodiment, the semiconductor production method of this invention includes an ion implantation step wherein ion implantation for forming an amorphous layer is conducted while cooling the Si substrate 12, so that diffusion of displacement atoms and holes, which are generated during the ion implantation, is suppressed so as to restrict the transition region at the interface between the amorphous layer 22 and the crystalline layer, while suppressing recrystallization due to heat applied during the ion implantation. It is therefore possible to form an amorphous layer 22 in which elongation of the dislocation loops 11 and increase in the number of dislocation loops 11 are suppressed.

In addition, since the depth of the impurity layer 23 formed by impurity ion implantation into the Si substrate 12 is smaller than that of the amorphous layer 22, the depth of the impurity layer 23 having impurities activated by a subsequent annealing can be maintained to be smaller than the depth of the amorphous layer 22.

Figure 1A:
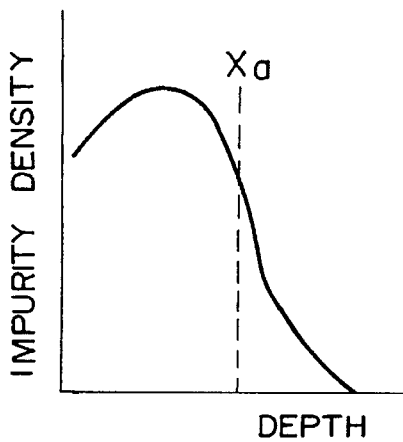
FIGS. 1A, 1C and 1E are graphical plots of the impurity concentration profiles of an amorphous layer showing impurity density as a function of depth in the substrate
Figure 1B:
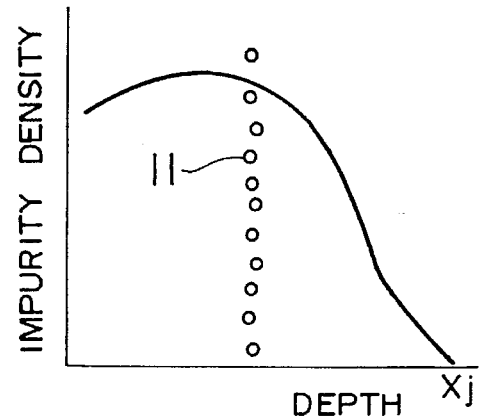
FIGS. 1B, 1D and 1F are graphical plots of the impurity concentration profiles of implanted impurity ions showing impurity density as a function of depth in the substrate and showing dislocation loop distributions, after annealing.
Figure 1C:
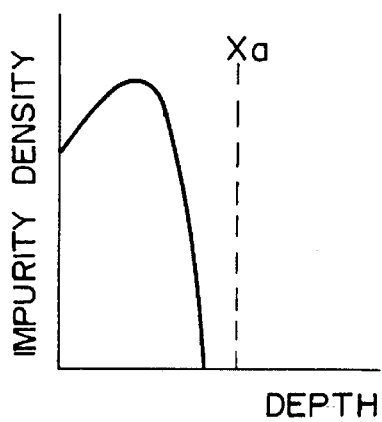
Figure 1D:
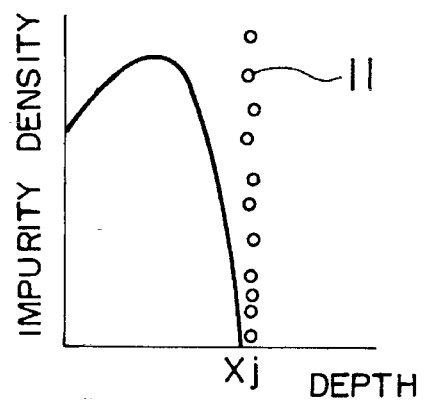
Figure 1E:
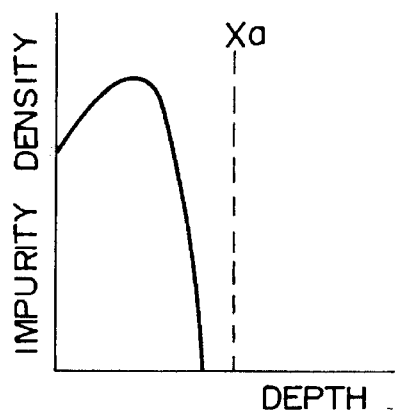
Figure 1F:
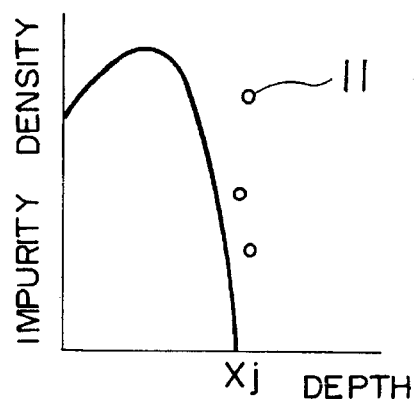

In the semiconductor production method according to an embodiment of this invention, the Si substrate 12 is kept cooled also during impurity ion implantation executed for the purpose of forming an impurity layer 23, so that it is possible to form the amorphous layer 22 with further suppressed elongation and increase in the number of the dislocation loops 11 at the interface between the crystalline layer and the amorphous layer 22, as shown in FIGS. 1E and 1F.

In the semiconductor production method according to an embodiment of this invention, diffusion of impurities is suppressed during annealing which is conducted for the purpose of activating impurities, so that the depth of the impurity layer 23 is further reduced with respect to the depth of the amorphous layer 22.

An embodiment of the present invention will now be described. Prior to the description of the embodiment, however, a description will be given as to the background procedure in which the present invention has been accomplished, with specific reference to FIGS. 1 to 4. FIG. 2 schematically shows a structure which has been obtained through a process comprising successively forming, on an Si substrate 12, an $SiO_2$ film 13 as a gate oxide film and a tungsten polycide layer 14 as a gate electrode 14; effecting implantation of $BF_2$ ions into the Si substrate 12 at an acceleration energy of 20 keV and a dosage of $3 \times 10^{15}$ cm$^{-2}$ while using the tungsten polycide film 14 as a mask, and conducting a 60-minute annealing at 800° C.

Figure 2A:
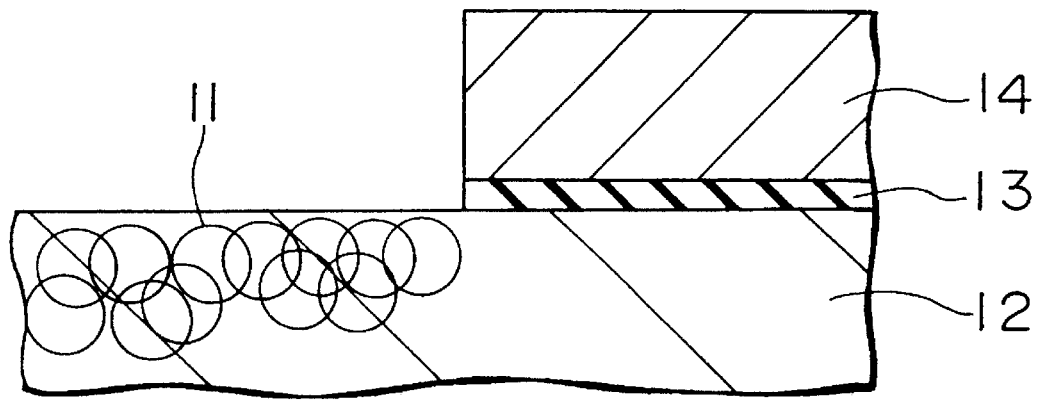
Figure 2B:
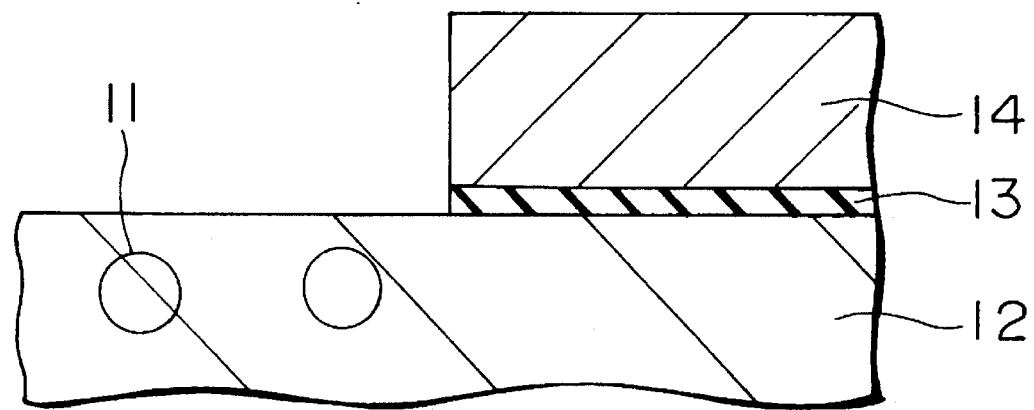
FIG. 2B shows the semiconductor structure which is obtained when the impurity layer is formed while the semiconductor substrate temperature is held at −40° C.

It is to be understood, however, that the temperature of the Si substrate 12 during implantation of $BF_2$ ions is +15° C. in the conditions shown in FIG. 2A, whereas, in the conditions shown in FIG. 2B, the substrate temperature is −40° C. From the comparison between FIG. 2A and FIG. 2B, it is understood that the density of dislocation loops 11 in the region down to 50 nm deep from the surface of the Si substrate 12 as obtained when the substrate temperature is maintained at −40° C. is about 1/100 that observed when the substrate temperature is held at +15° C.

FIG. 3 shows the relationship between the temperature at which the semiconductor substrate is maintained during ion implantation thereto and the density of dislocation regions 11 in the semiconductor substrate as observed after the annealing. Two ranges of substrate temperature are employed: a temperature region around and above the normal temperature and a low temperature region.

Figure 3A:
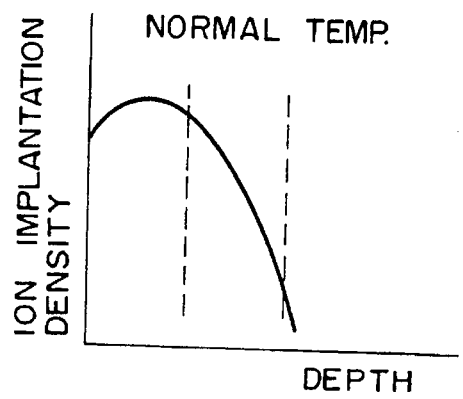
FIGS. 3A and 3B are graphs showing densities of ion implantation.
Figure 3B:
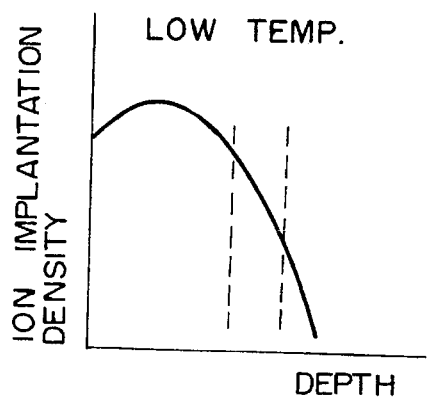
Figure 3C:
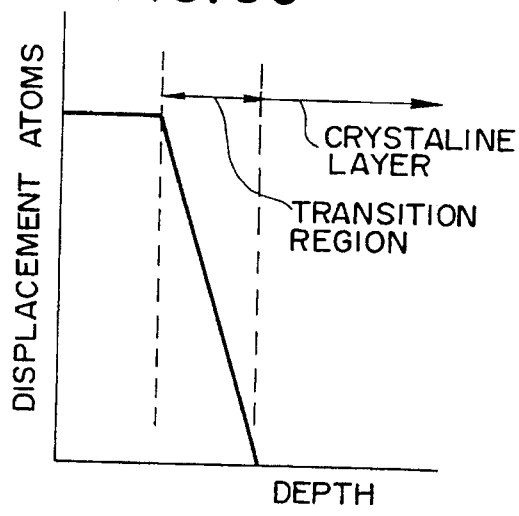
FIGS. 3C and 3D are graphs showing the density of displacement atoms.
Figure 3D:
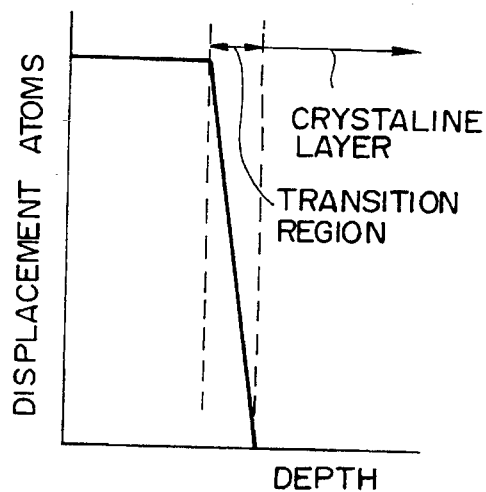
Figure 3E:
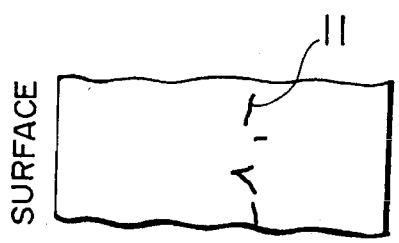
FIGS. 3E and 3F are sectional side elevational views of semiconductor structures.
Figure 3F:
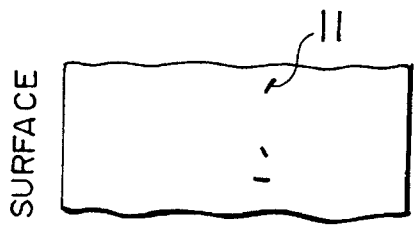

Even though the same profile of ion implantation density are employed as shown in FIGS. 3A and 3B, when the substrate temperature is maintained low, diffusion of displacement atoms and holes generated during ion implantation is suppressed so as to restrict the transition region at the interface between the amorphous and crystalline layers and, at the same time, recrystallization due to heat input during ion implantation is suppressed, as will be seen from a comparison between FIGS. 3C and 3D. Thus, elongation and increase of dislocation loops 11 at the interface between the amorphous and crystalline layers are suppressed when ion implantation is conducted at low substrate temperature as will be understood from FIGS. 3E and 3F, and this is considered to be the reason why the results shown in FIG. 2 have been obtained.

The results shown in FIGS. 2 and 3 apply both to the ion implantation for forming the impurity layer and to the ion implantation which is intended to form the amorphous layer alone.

Figure 4:
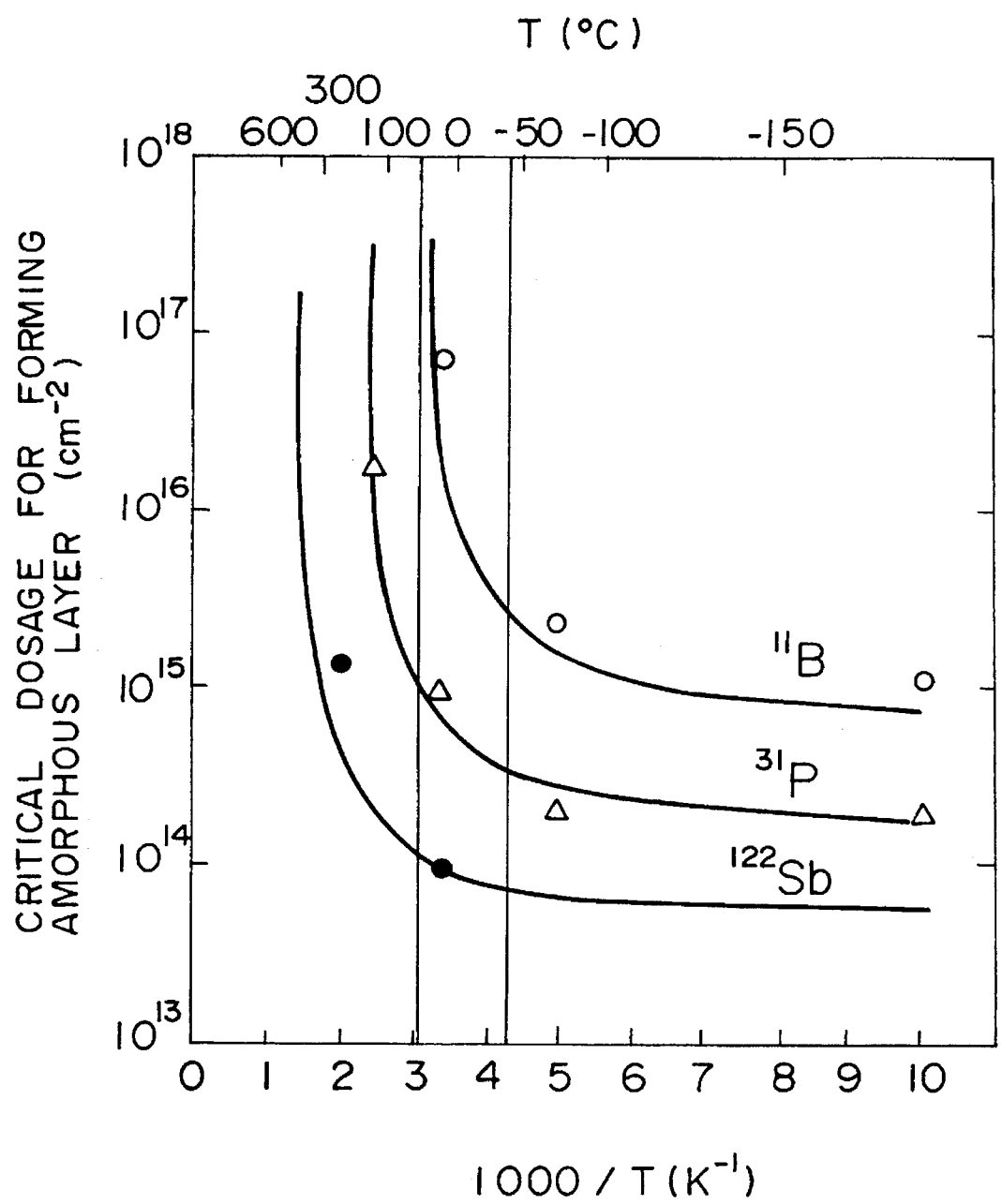
FIG. 4 is a graph showing the relationship between the Si substrate temperature and critical dosage which is necessary for forming an amorphous layer in the Si substrate while suppressing generation of dislocation loops.

It is to be understood, however, that the critical dosage necessary for forming an amorphous Si layer on an Si substrate while suppressing generation of dislocation loops 11 varies according to the kind of the ions and the temperature of the Si substrate, as will be seen from FIG. 4. Therefore, it is necessary to select a suitable combination of these factors, when the ion implantation is performed while maintaining the Si substrate at a low temperature.

For instance, when Si ion implantation into an Si substrate for forming an amorphous Si layer is carried out while the Si substrate is maintained at a temperature not higher than −40° C., the implantation has to be done at a dosage of from $1 \times 10^{15}$ to $1 \times 10^{16}$ cm$^{-2}$. When ions of Ga, Ge or As are implanted into an Si substrate held at a temperature not higher than 0° C., the dosage should range from $3 \times 10^{14}$ to $1 \times 10^{16}$ cm$^{-2}$.

FIG. 5 shows an embodiment of the present invention. In this embodiment, as shown in FIG. 5A, an $SiO_2$ film 15 is formed on the device isolation region of an Si substrate 12 and, thereafter, a well 16 and a channel stop (not shown) are formed and, at the same time, threshold voltage is adjusted by implantation of respective types of ions while masking portions to be masked with a resist (not shown). Then, an $SiO_2$ film 13 as a gate oxide film and a tungsten polycide layer 14 as a gate electrode are formed.

Then, a resist (not shown) is placed to mask a required portion and, by using this resist together with the tungsten polycide layer 14 and the $SiO_2$ film 15 as a mask, ion implantation is performed so as to form a lightly-doped impurity layer 17 which is to be used for an LDD structure. Then, a so-called pocket layer 19 may be formed under the lightly-doped impurity layer 17 so as to reduce short-channel effects. Pocket layer 19 is formed as required by ion implantation of an impurity of an opposite type as that used in impurity layer 17. Pocket layer 19 may be formed simultaneously with, before or after the formation of impurity layer 17. After formation of pocket layer 19, a side wall, such as of $SiO_2$ film 21, is formed on the tungsten polycide layer 14.

The formation of such a pocket layer 19 is not essential. The formation of a pocket layer 19, when necessary, may also be conducted by a process other than the described implantation: namely, by doping the $SiO_2$ film 21 with impurity, and causing the impurity to be thermally diffused from the SiO$_2$ film 21 into the Si substrate 12 during annealing which will be described later.

Figure 5A:
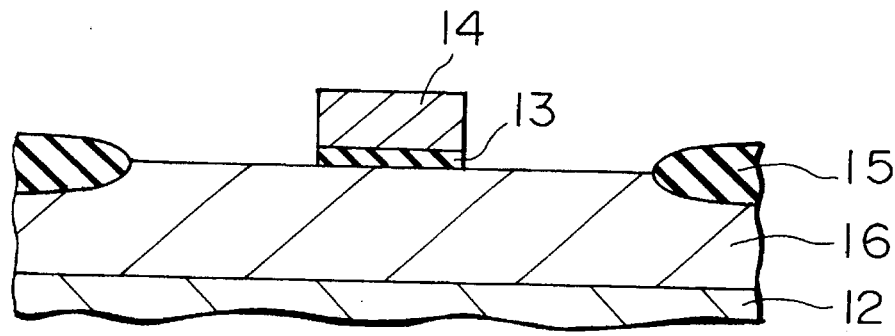
FIGS. 5A–5D are elevated cross-sectional views of a semiconductor device illustrating successive steps of forming a semiconductor device in accordance with an embodiment of the present invention.
Figure 5B:
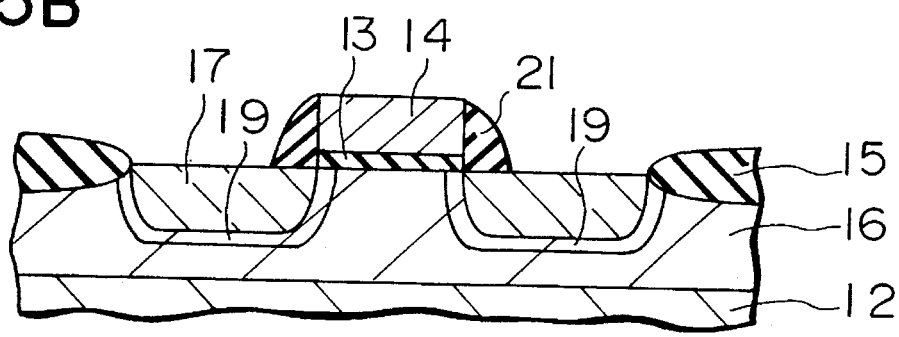
Figure 5C:
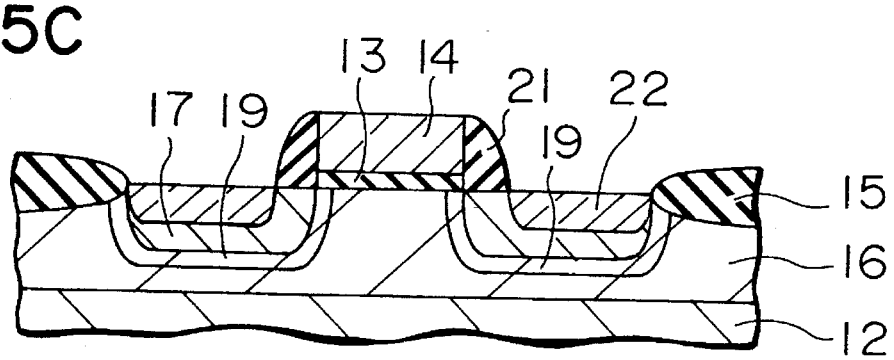

Then, an SiO$_2$ film is formed to a thickness of 5 nm or greater by thermal oxidation or CVD, for the purpose of preventing contamination and suppressing channeling during ion implantation. This SiO$_2$ film, however, is not essential. Then, a resist (not shown) is placed to mask a required portion and, by using this resist together with the tungsten polycide layer 14 and the SiO$_2$ films 15, 21 as a mask, ion implantation is conducted, so that an amorphous layer 22 is formed in the Si substrate 12 as shown in FIG. 5C.

The type of ion to be implanted for the purpose of forming the amorphous layer 22 is preferably selected from a group of elements having large mass numbers, e.g., Si, Ge, As and so forth, provided that the element does not form a deep level in the Si. The acceleration energy employed in the ion implantation should be selected such that the projection range $R_p$, the dispersion $\Delta R_p$ of the same and the depth $X_j$ of the impurity layer to be formed meet the condition of:

$$R_p + (1 \text{ to } 4) \times \Delta R_p = X_j$$

Namely, the depth $X_a$ of the amorphous layer 22 is determined to be smaller than the depth $X_j$ of the impurity layer which is to be formed subsequently. For instance, formation of an amorphous layer 22 with Ge ions prior to the formation of an impurity layer having a depth $X_j$ of 0.08 μm requires an acceleration energy of from 130 to 70 keV. What value ranging from 1 to 4 in the formula shown above is to be used depends on the dosage.

The dosage, when Si ions are used for example, has to be $1 \times 10^{15}$ cm$^{-2}$ or greater, whereas, when Ge ions are used, the dosage should be $3 \times 10^{14}$ cm$^{-2}$ or greater. As shown in FIG. 4, the temperature of the Si substrate during the ion implantation should be −40° C. or lower when Si ions are used and 0° C. or lower when Ge ions are used.

Figure 5D:
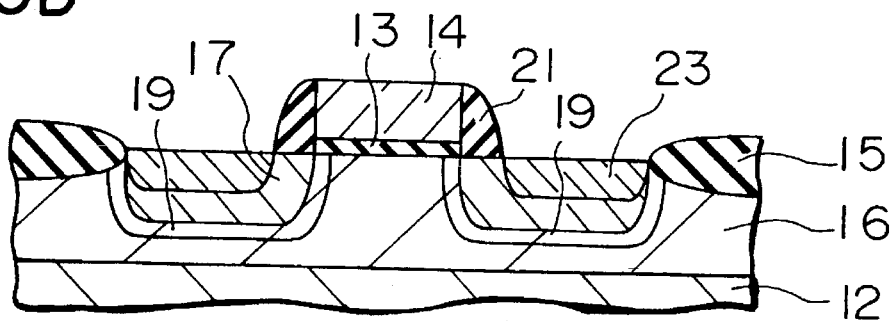
Figure 6:
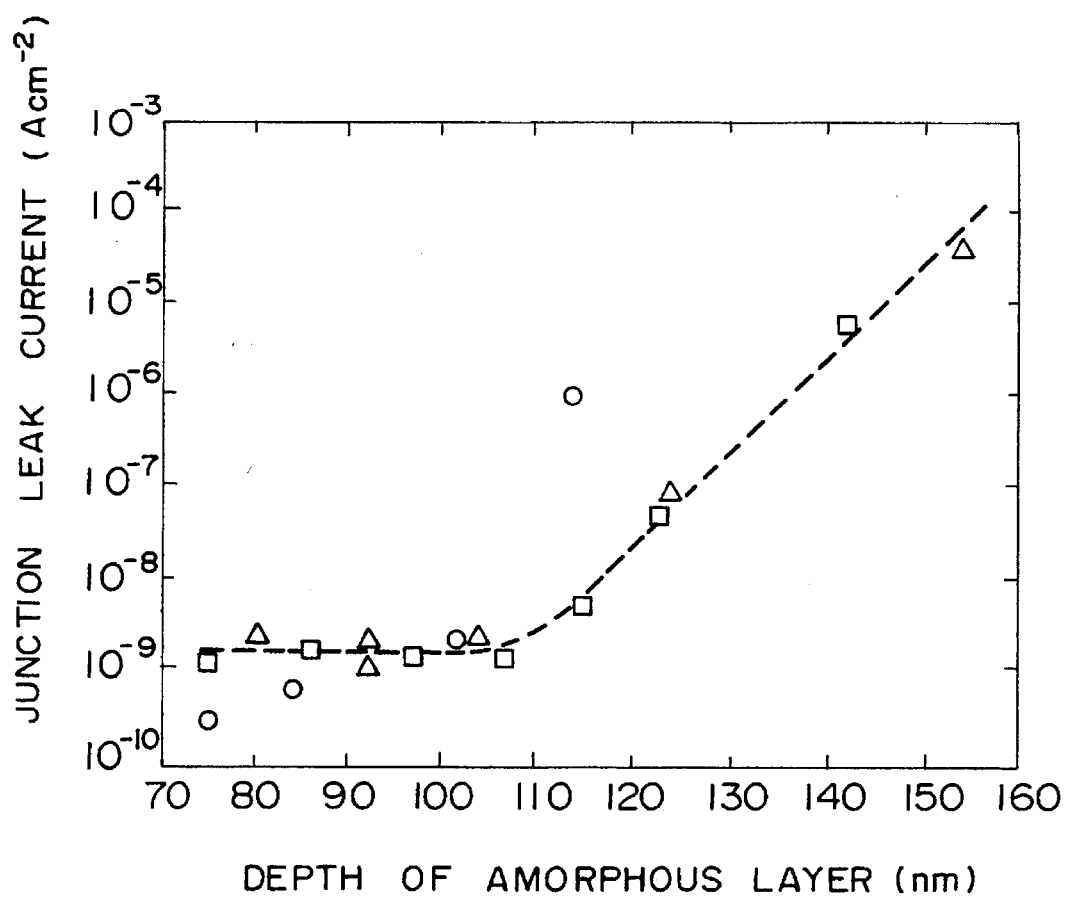
FIG. 6 is a graph showing the change in leak current at the junction between an impurity layer and an Si substrate as observed when the depth of the amorphous layer is changed while the depth of the impurity layer is held constant.

Then, a resist (not shown) is placed to mask a portion to be masked and, by using this resist together with the tungsten polycide layer 14 and the SiO$_2$ films 15, 21 as a mask, ion implantation is effected to form an impurity layer 23 on the Si substrate 12, as shown in FIG. 5D. In order that the impurity layer 23 is of p type, BF$_2$ or B ions are used, whereas, when the impurity layer 23 is to be formed to have n type of conduction, As or P ions are used.

The dosage of ion implantation should range from $1 \times 10^{15}$ to $5 \times 10^{15}$ cm$^{-2}$ or so, while the acceleration energy should be determined such that the projection range $R_p$, the dispersion $\Delta R_p$ of the same and the depth $X_j$ of the impurity layer 23 meet the condition of:

$$R_p + 6 \times \Delta R_p < X_j$$

For instance, when an impurity layer 23 having a depth $X_j$ of 0.08 μm is to be formed by using As ions, the acceleration energy should be not greater than 40 keV, whereas, when BF$_2$ ions are used, the acceleration energy should not be greater than 20 keV.

Then, an inter-layer insulating film (not shown) is formed, and an annealing is conducted in a nitrogen atmosphere in order to activate the impurities in the impurity layers 17, 23. The annealing may be conducted in an electric oven at a temperature of from 800° to 900° C. and for a period of from 10 to 60 minutes, or may be effected through a rapid heating at 900° to 1100° C. for 1 to 300 seconds. This annealing, however, may be conducted prior to the formation of the inter-layer insulating film. After annealing, amorphous layer 22 may not appear distinctly. After annealing, wiring and other necessary steps are taken, thus completing the production of the semiconductor device.

The described embodiment employs the impurity layer 23 of a depth smaller than that of the amorphous layer 22, so that the depth of the impurity layer 23 is smaller than that of the amorphous layer even after the annealing. Nevertheless, the junction leak current at the impurity layer 23 is reduced, by virtue of the fact that the amorphous layer 22 is formed while the Si substrate 12 is kept cooled.

In the described embodiment, the cooling of the Si substrate 12 is effected only during the formation of the amorphous layer 22. However, as stated before in connection with FIGS. 2 and 3, cooling of the Si substrate 12 is effective also during forming the impurity layer 23. By employing such cooling of the Si substrate 12, it is possible to obtain a semiconductor device which exhibits further reduction in the junction leak current.

Although in the described embodiment the annealing for activating impurities in the impurity layer 23 is conducted in a nitrogen atmosphere, the annealing may be carried out in a halogen-containing atmosphere such as NF$_3$ or HCl. The use of such a halogen-containing atmosphere suppresses diffusion of impurities during annealing, thus achieving a further reduction of the depth of the impurity layer 23 with respect to the amorphous layer 22.

The semiconductor production methods in accordance with this invention permit formation of an amorphous layer having suppressed elongation and a suppressed or smaller increase of dislocation loops at the interface between the amorphous layer and the crystalline layer and, at the same time, allows the impurity layer having impurity activated through annealing to have a depth smaller than that of the amorphous layer. It is therefore possible to form a diffusion layer having a small depth and providing a reduced junction leak current, thus enabling production of microfine semiconductor devices.

Although the present invention has been described with reference to certain preferred embodiments, modification or changes may be made therein without departing from the scope and spirit of the present invention as defined by the appended claims.

What is claimed is:

1. A method for making a semiconductor device comprising the steps of:

providing a silicon substrate;

cooling the substrate to a temperature of −40° C. or less and implanting Si ions into a surface of the substrate at a dosage of from about $1 \times 10^{15}$ to $1 \times 10^{16}$ ions/cm$^2$ to preamorphize the surface of the silicon substrate to form an amorphous layer having a first depth dimension;

implanting impurity ions in the preamorphized surface to form an impurity layer having a second depth dimension less than that of the amorphous layer; and thereafter, annealing the silicon substrate in an atmosphere comprising a halogen element after said impurity implantation step to activate the implanted impurity ions.

2. A method for making a semiconductor device comprising the steps of:

providing a silicon substrate;

cooling the substrate to a temperature of about 0° C. or below and implanting ions selected from the group consisting of Ga ions, Ge ions, and As ions into the silicon substrate at a dosage of from about $3 \times 10^{14}$ to about $1 \times 10^{16}$ ions/cm$^2$ to preamorphize a surface of the silicon substrate to form an amorphous layer having a first depth dimension;

implanting impurity ions into the surface of the substrate to form an impurity layer having a second depth dimension less than that of the amorphous layer; and thereafter, annealing the silicon substrate in an atmosphere comprising a halogen element after said impurity implantation step to activate the implanted impurity ions.

3. The method as defined in claim 1, wherein the silicon substrate is cooled during said impurity ion implantation step.

4. The method as defined in claim 2, wherein the silicon substrate is cooled during said impurity ion implantation step.

5. A method as defined in claim 1, wherein said atmosphere comprises $NF_3$ or HCl.

6. A method as defined in claim 1, wherein said annealing step is performed by heating the substrate to a temperature of from about 800° to about 900° C. for a period of from about 10 to about 60 minutes.

7. A method as defined in claim 1, wherein said annealing step is performed by rapidly heating the substrate to a temperature of from about 900° to about 1100° C. for a period of from about 1 to about 300 seconds.

8. A method as defined in claim 1, wherein the implantation of Si ions is performed using a mask comprising a gate electrode of an MOS transistor.

9. A method as defined in claim 8, wherein said mask further comprises sidewalls formed in said gate electrode.

10. A method as defined in claim 1, wherein said impurity layer is formed in a lightly-doped impurity layer comprising a first impurity type in an LDD structure defined in the silicon substrate.

11. A method as defined in claim 10, further comprising the step of forming a pocket layer under the lightly-doped impurity layer by introducing an impurity of an opposite type to said first impurity type in the silicon substrate.

12. A method as defined in claim 2, wherein said atmosphere comprises $NF_3$ or HCl.

13. A method as defined in claim 2, wherein said annealing step is performed by heating the substrate to a temperature of from about 800° to about 900° C. for a period of from about 10 to about 60 minutes.

14. A method as defined in claim 2, wherein said annealing step is performed by rapidly heating the substrate to a temperature of from about 900° to about 1100° C. for a period of from about 1 to about 300 seconds.

* * * * *